United States Patent
Kanda

(10) Patent No.: US 10,560,106 B2
(45) Date of Patent: Feb. 11, 2020

(54) CLOCK RECOVERY CIRCUIT, SEMICONDUCTOR INTEGRATED CIRCUIT DEVICE, AND RADIO FREQUENCY TAG

(71) Applicant: FUJITSU LIMITED, Kawasaki-shi, Kanagawa (JP)

(72) Inventor: Kouichi Kanda, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 42 days.

(21) Appl. No.: 15/794,184

(22) Filed: Oct. 26, 2017

(65) Prior Publication Data

US 2018/0123598 A1 May 3, 2018

(30) Foreign Application Priority Data

Oct. 28, 2016 (JP) .................................. 2016-211711

(51) Int. Cl.
| H03L 7/08 | (2006.01) |
| H03K 5/15 | (2006.01) |
| G06K 19/07 | (2006.01) |
| H04L 7/027 | (2006.01) |
| H04L 7/033 | (2006.01) |

(52) U.S. Cl.
CPC ........ *H03L 7/0807* (2013.01); *G06K 19/0723* (2013.01); *H03K 5/1508* (2013.01); *H04L 7/027* (2013.01); *H04L 7/0338* (2013.01)

(58) Field of Classification Search
CPC ..... H03K 5/1508; H03L 7/0807; H04L 7/027; G06K 19/0723
See application file for complete search history.

(56) References Cited

U.S. PATENT DOCUMENTS

| 8,085,074 B1* | 12/2011 | Janardhanan | H03L 7/10 327/149 |
| 9,432,025 B1* | 8/2016 | Khor | H03L 1/00 |
| 2002/0057118 A1* | 5/2002 | Tang | H03L 7/081 327/158 |
| 2002/0180501 A1* | 12/2002 | Baker | G11C 7/1051 327/158 |
| 2006/0068744 A1* | 3/2006 | Maligeorgos | H03L 7/00 455/318 |
| 2010/0079179 A1 | 4/2010 | Atsumi | |
| 2012/0200542 A1* | 8/2012 | Hong | G09G 3/2096 345/204 |
| 2017/0201010 A1* | 7/2017 | Kim | H01Q 9/42 |

FOREIGN PATENT DOCUMENTS

| JP | 2004-320607 | 11/2004 |
| JP | 2010-109973 | 5/2010 |

* cited by examiner

*Primary Examiner* — Kabir A Timory
(74) *Attorney, Agent, or Firm* — Fujitsu Patent Center

(57) ABSTRACT

A clock recovery circuit includes a delay line circuit configured to output a plurality of first clocks having different phases obtained by delaying an input data signal, a register circuit configured to determine and write received data in the input data signal based on the first clocks, and a control circuit configured to control the writing of the data in the register circuit based on transitions of the input data signal.

18 Claims, 14 Drawing Sheets

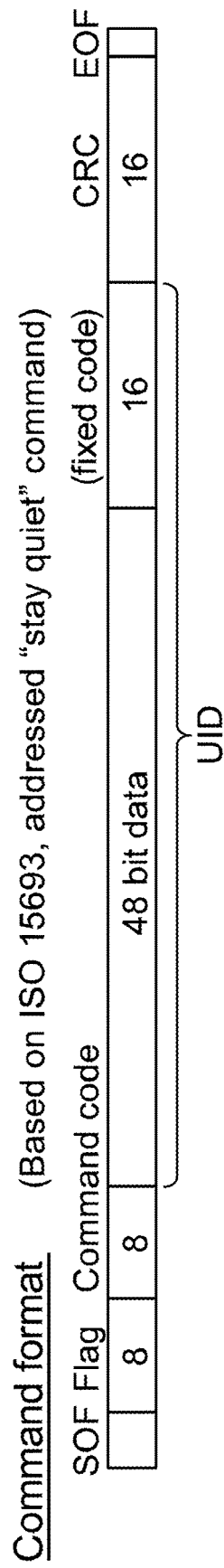
FIG. 4A
FIG. 4B
Command format (Based on ISO 15693, addressed "stay quiet" command)
Coding format
One "pause" appears in every 75.52 μs. (2 bit information represented by 4 different pause locations)
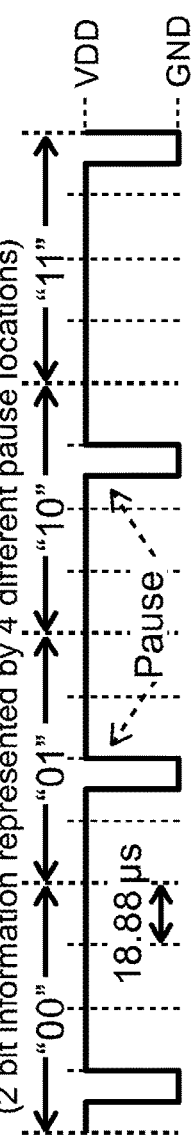
FIG. 4C
| Standard | ISO 15693 |
| Bit rate | 26.48 kbps |
| Data coding | Pulse-Position Modulation |

Goal

$t_1$ = 18.88 μs
$t_1+t_2$ = 18.88 μs ×2
⋮
$t_1+t_2+...+t_6$ = 18.88 μs ×6
pulse width @ ph[1]~ph[6] = $t_P$

Cal. steps

1. Cal $t_1$ by selecting # of stages in DL #1
2. Cal pulse width @ DL #1 output
3. Cal $t_1+t_2$ by selecting # of stage # in DL #2
4. Cal pulse width @ DL #2 output
   ⋮

FIG. 7A
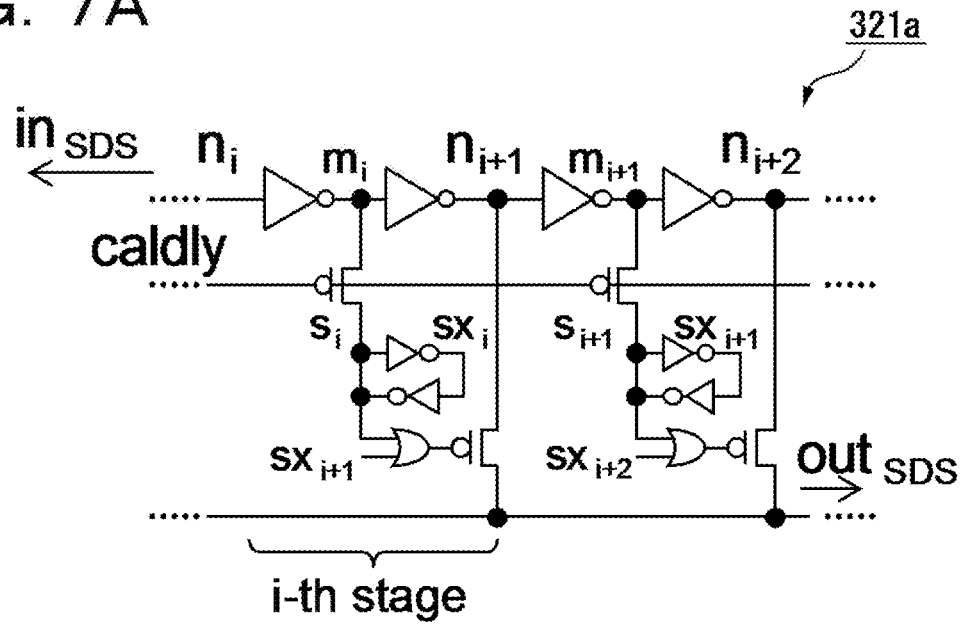
FIG. 7B
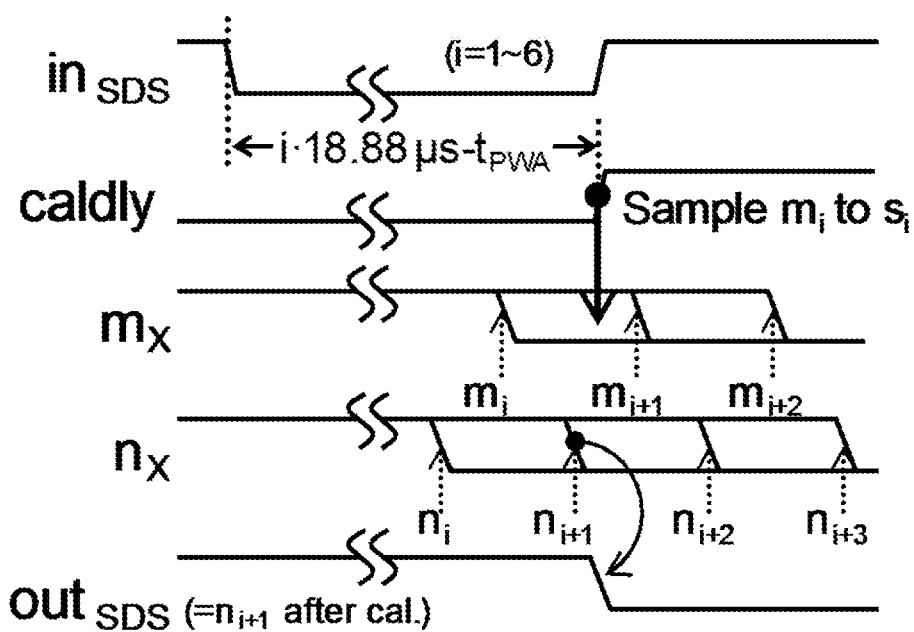
FIG. 7C
| Node | $s_i$ | $s_{i+1}$ | $s_{i+2}$ | ... |
|---|---|---|---|---|
| Sampled value | 0 | 1 | 1 | |

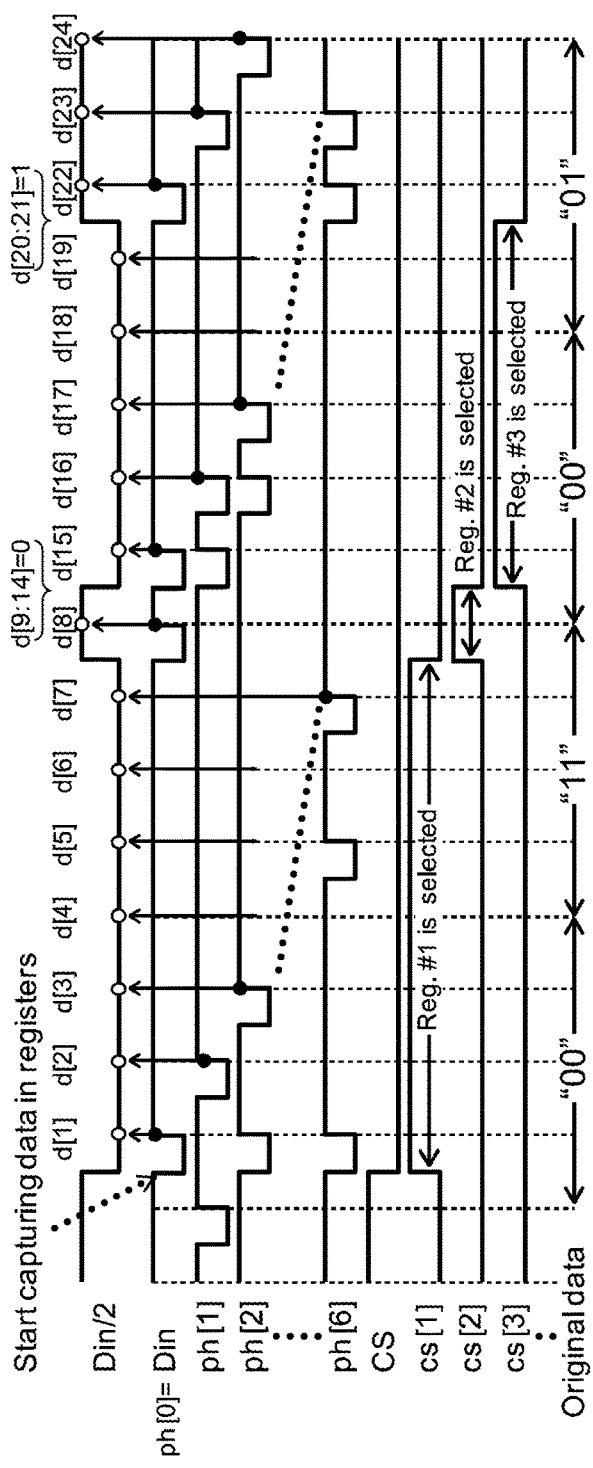
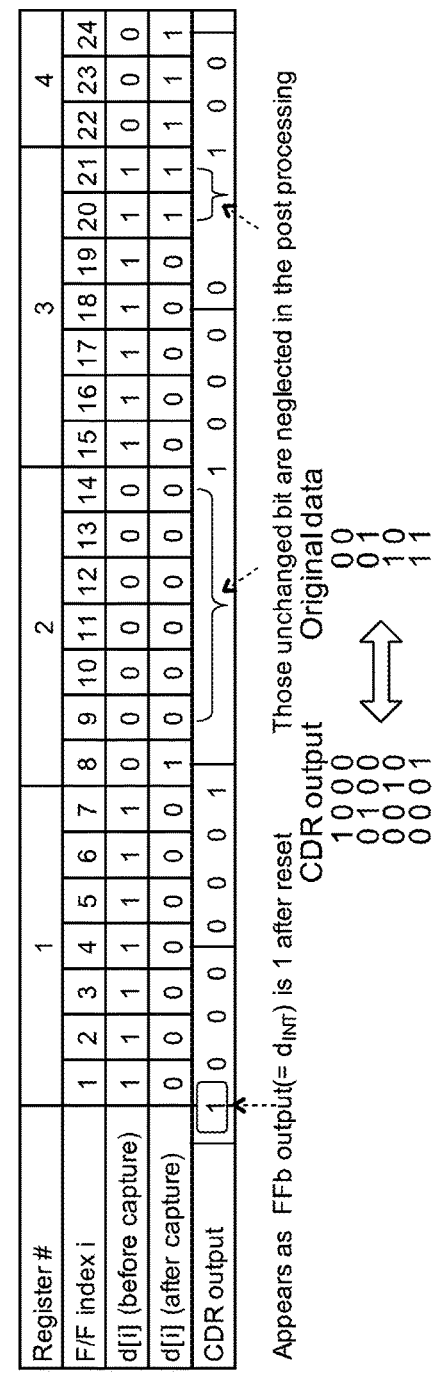
FIG. 10A
FIG. 10B

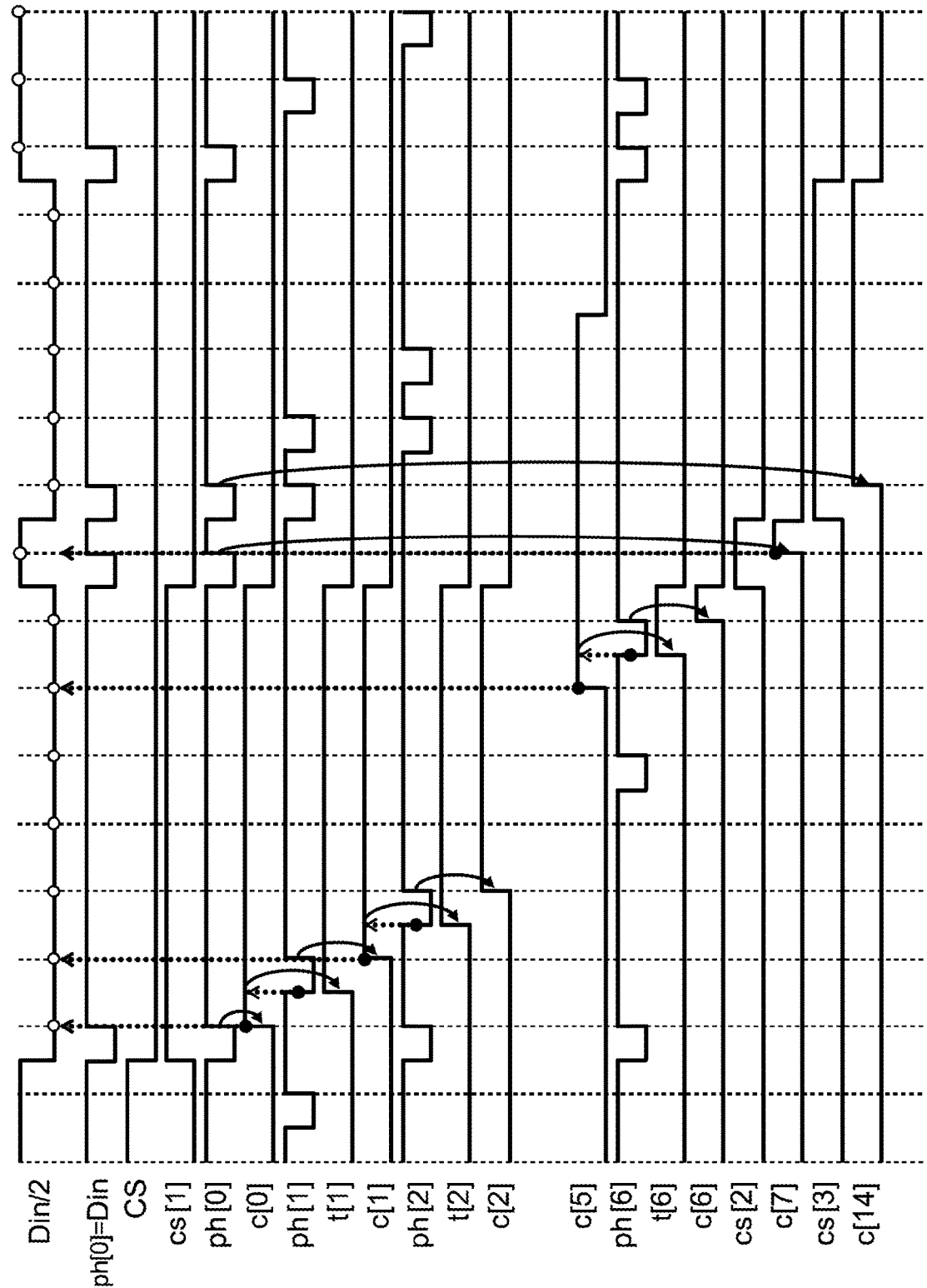

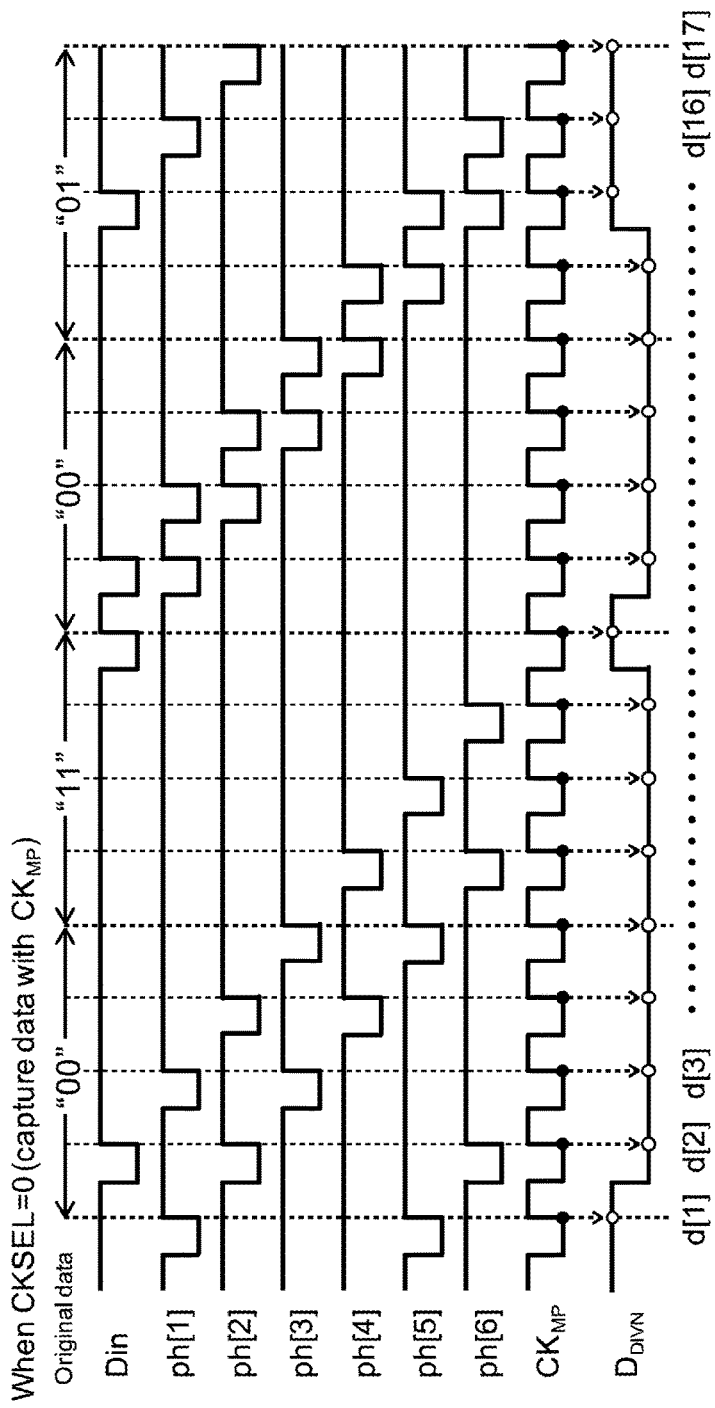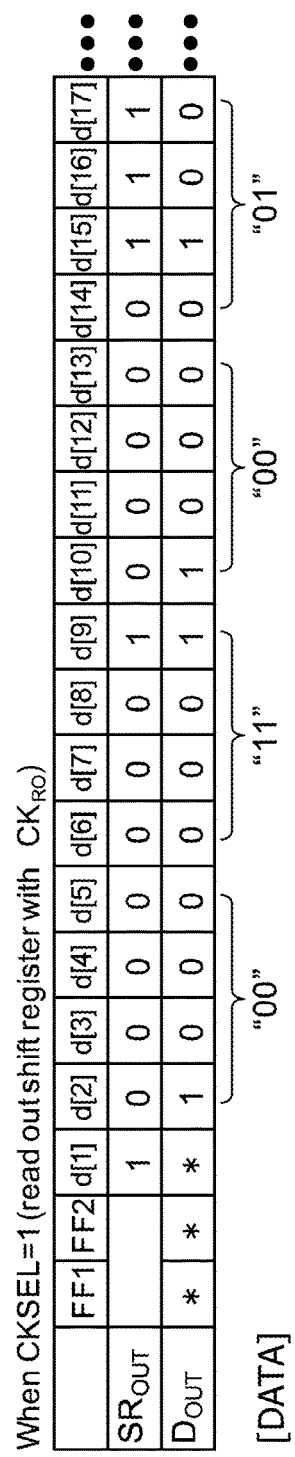
FIG. 13A
FIG. 13B

CLOCK RECOVERY CIRCUIT, SEMICONDUCTOR INTEGRATED CIRCUIT DEVICE, AND RADIO FREQUENCY TAG

CROSS-REFERENCE TO RELATED APPLICATION

This application is based upon and claims the benefit of priority of the prior Japanese Patent Application No. 2016-211711, filed on Oct. 28, 2016, the entire contents of which are incorporated herein by reference.

FIELD

The present technology discussed herein is related to a clock recovery circuit, a semiconductor integrated circuit device, and a radio frequency (RF) tag.

BACKGROUND

Recently, organic semiconductor field-effect transistors (organic semiconductor field effect transistors (FETs)) operating with low power consumption have been researched and developed, and as an object for application thereof, radio frequency identification (RFID), for example, is drawing attention. Here, RFID reads and writes data in an RF tag on a noncontact basis using a radio wave. An RFID (RF tag) is desired to have an operating speed of approximately 20 to 100 kb/second according to a standard such as International Organization for Standardization (ISO) 14443, ISO 15693, or the like.

An RF tag to which a silicon semiconductor is applied, for example, reproduces (generates) a clock having a given frequency by receiving and frequency-dividing a signal of 13.56 MHz sent from a reader (reader-writer). For example, in ISO 15693, a clock of 26 kHz is generated by performing 1/512 frequency division of the carrier of 13.56 MHz from the reader, and in ISO 14443, a clock of 106 kHz is generated by performing 1/128 frequency division of the carrier of 13.56 MHz from the reader. Each clock is used as a clock having a symbol rate.

However, in an RF tag to which an organic semiconductor is applied, the operating frequency of an oscillator is, for example, on the order of hundreds of kHz, and it is difficult to generate a clock having a symbol rate by frequency-dividing the carrier of 13.56 MHz from the reader.

Incidentally, various proposals have been made with regard to clock recovery circuits (clock data recovery (CDR) circuits) applied to RF tags (RFID tags) or the like.

CITATION LIST

Patent Documents

[Patent Document 1] Japanese Laid-open Patent Publication No. 2004-320607
[Patent Document 2] Japanese Laid-open Patent Publication No. 2010-109973

SUMMARY

According to an aspect of the embodiment, a clock recovery circuit includes a delay line circuit configured to output a plurality of first clocks having different phases obtained by delaying an input data signal, a register circuit configured to determine and write received data in the input data signal based on the first clocks, and a control circuit configured to control the writing of the data in the register circuit based on transitions of the input data signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A, 4B, 4C, and 4D are diagrams of assistance in explaining a case where ISO 15693 is applied to the present embodiment;
FIGS. 7A, 7B, and 7C are diagrams (1) of assistance in explaining, in more detail, the delay line circuit described with reference to FIGS. 5A and 5B and FIG. 6;
FIGS. 10A and 10B are diagrams (1) of assistance in explaining operation of the clock recovery circuit in the first example illustrated in FIG. 9;
FIG. 11 is a diagram (2) of assistance in explaining the operation of the clock recovery circuit in the first example illustrated in FIG. 9;
FIGS. 13A and 13B are diagrams of assistance in explaining operation of the clock recovery circuit in the second example illustrated in FIG. 12.

DESCRIPTION OF EMBODIMENT

As described above, in an RF tag to which an organic semiconductor is applied, for example, it is difficult to generate a clock having a symbol rate by frequency-dividing a signal sent from a reader as in an RF tag to which a silicon semiconductor is applied.

In addition, a clock recovery circuit (CDR) generates a clock based on a phase locked loop (PLL). In this case, a voltage control oscillator (voltage controlled oscillator (VCO)) is used. However, because of large variations in the organic semiconductor, there is a fear that the generated (reproduced) clock may not be locked to a desired frequency.

It is to be noted that a clock recovery circuit, a semiconductor integrated circuit device, and an RF tag according to the present embodiment may be those to which an organic semiconductor is applied, and also may be those to which various semiconductors including silicon semiconductors and compound semiconductors are applied.

Figure 1:
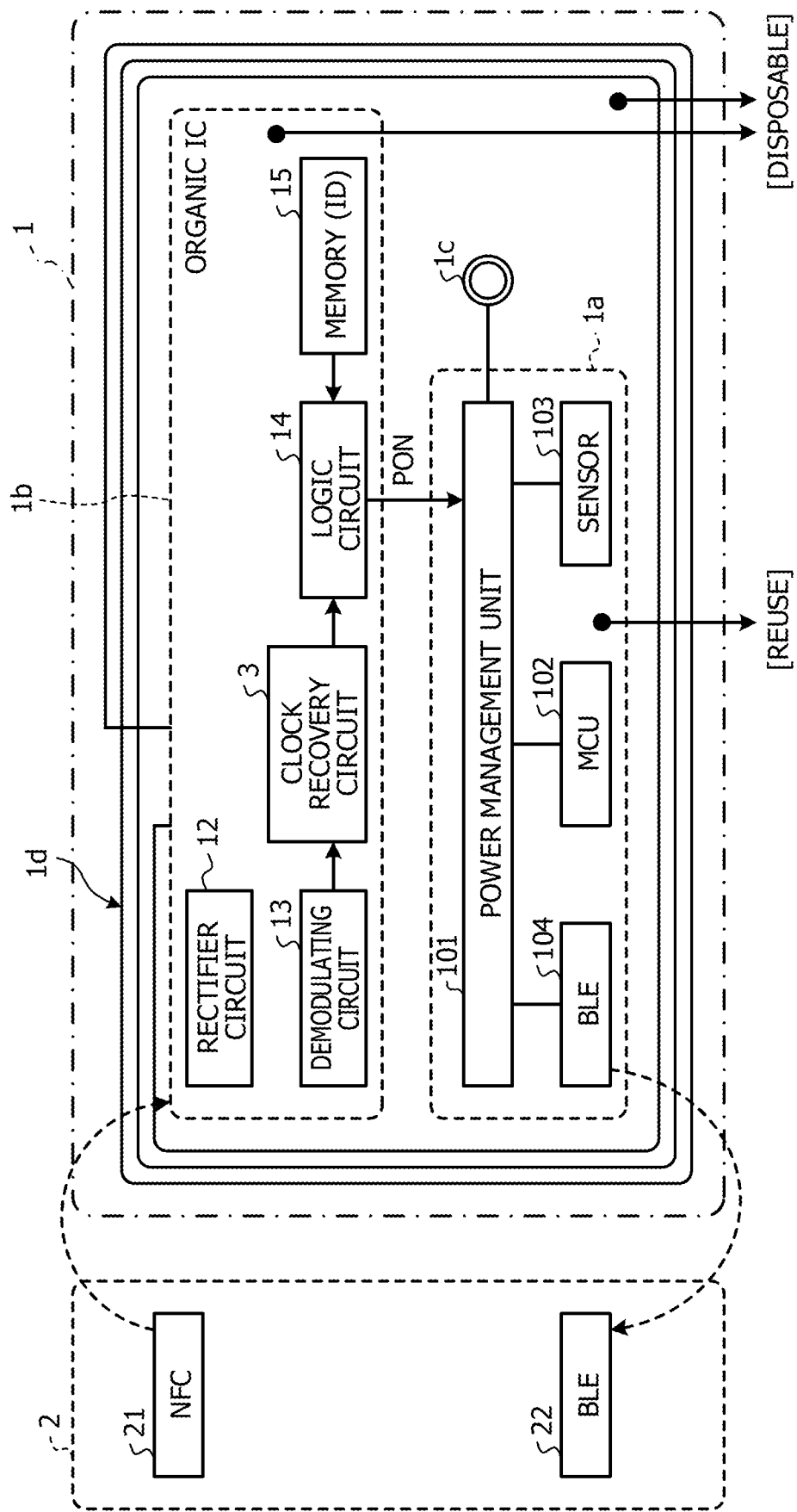
FIG. 1 is a diagram schematically illustrating an example of an RFID to which a present embodiment is applied.

Examples of a clock recovery circuit, a semiconductor integrated circuit device, and an RF tag will hereinafter be described in detail with reference to the accompanying drawings. FIG. 1 is a diagram schematically illustrating an example of an RFID to which the present embodiment is applied. As illustrated in FIG. 1, an RF tag 1 includes a sensor main body circuit unit 1a, a short-range radio communication circuit unit 1b, and a battery 1c.

As illustrated in FIG. 1, an RFID (RFID system) includes the RF tag 1 and a reader-writer (reader) 2. The RF tag 1 includes the sensor main body circuit unit 1a, the short-range radio communication circuit unit 1b, the battery 1c, and an antenna 1d. The sensor main body circuit unit 1a and the short-range radio communication circuit unit 1b form a tag integrated circuit (IC) (semiconductor integrated circuit), and, for example, are supplied with power from the reader 2 and perform short-range radio communication (near field communication (NFC)) by the antenna 1d provided to the RF tag 1. Here, the reader 2 is, for example, a smart phone or the like. The reader 2 includes a short-range radio communication circuit unit (NFC) 21 and a BLE control unit (Bluetooth (registered trademark) Low Energy (registered trademark) (BLE)) 22.

The sensor main body circuit unit 1a is, for example, formed by a silicon semiconductor integrated circuit (silicon IC) including a silicon transistor. The short-range radio communication circuit unit 1b is, for example, formed by an organic semiconductor integrated circuit (organic IC) including an organic transistor. The sensor main body circuit unit 1a operates on power supplied from the battery 1c such as a button battery or the like. In this case, the sensor main body circuit unit 1a is, for example, normally in an off state (normally off), and is set in an operating state after a power-on signal PON from the short-range radio communication circuit unit 1b is input to the sensor main body circuit unit 1a.

The sensor main body circuit unit 1a includes a power management unit 101, a microcontroller unit (MCU) 102, a sensor 103, and a BLE control unit (BLE) 104. In addition, as described above, the short-range radio communication circuit unit 1b is, for example, supplied with power from the reader 2 by the antenna 1d, and performs short-range radio communication with the short-range radio communication circuit unit 21 of the reader 2. The short-range radio communication circuit unit 1b includes, for example, a rectifier circuit 12, a demodulating circuit 13, a logic circuit (a control circuit or a control logic unit) 14, a memory 15, and a clock recovery circuit (CDR) 3. Incidentally, the memory 15 is a nonvolatile memory such as a flash electrically erasable programmable read-only memory (EEPROM) or the like, and stores data and an identification (ID) to be transmitted from the RF tag 1 to the reader 2.

In the short-range radio communication circuit unit 1b, the rectifier circuit 12, for example, generates power from a signal of the reader 2, the signal being received via the antenna 1d, and supplies the power to each circuit, and receives a signal from the reader 2. For example, the clock recovery circuit 3 receives a signal (input data signal Din) from the demodulating circuit 13 and generates a clock, and performs reproduction or the like of received data in the input data signal Din by using the generated clock. The clock recovery circuit 3 thereby performs data reception from the reader 2. In order for the RF tag 1 (short-range radio communication circuit unit 1b) to thus receive the signal from the reader 2, clock generation at a symbol rate is desired.

Here, the reader 2 is, for example, a smart phone or the like. The RF tag 1 is, for example, intended to measure a body temperature or a pulse in a state of being stuck to a human body or measure a temperature or the like during transport in a state of being stuck to freight being transported. The RF tag 1 stores the above-described given ID. Then, for example, after the smart phone (reader) 2 confirms the given ID of the RF tag 1, data such as the body temperature or the pulse of the human body or changes in the temperature and humidity of the freight during the transport the data being stored in the RF tag 1, is transmitted to the reader 2 via the BLE.

For example, when the ID of the RF tag 1 is confirmed, the short-range radio communication circuit unit 1b outputs a power-on signal PON to set the sensor main body circuit unit 1a in an operating state, and the data is transmitted by radio from the BLE 104 of the sensor main body circuit unit 1a to the BLE 22 of the reader 2. Incidentally, the short-range radio communication circuit unit (organic IC) 1b and the antenna 1d may be manufactured by inexpensive printing, for example, and are therefore discarded after usage (disposable). On the other hand, the silicon semiconductor integrated circuit 1a and the battery 1c are expensive, and are therefore reused repeatedly a plurality of times. In addition, the above-described applications of the RF tag 1 are a mere example, and are of course not limited to the purpose of obtaining the body temperature or the temperature changes in a state of being stuck to the human body or the freight.

Figure 2A:
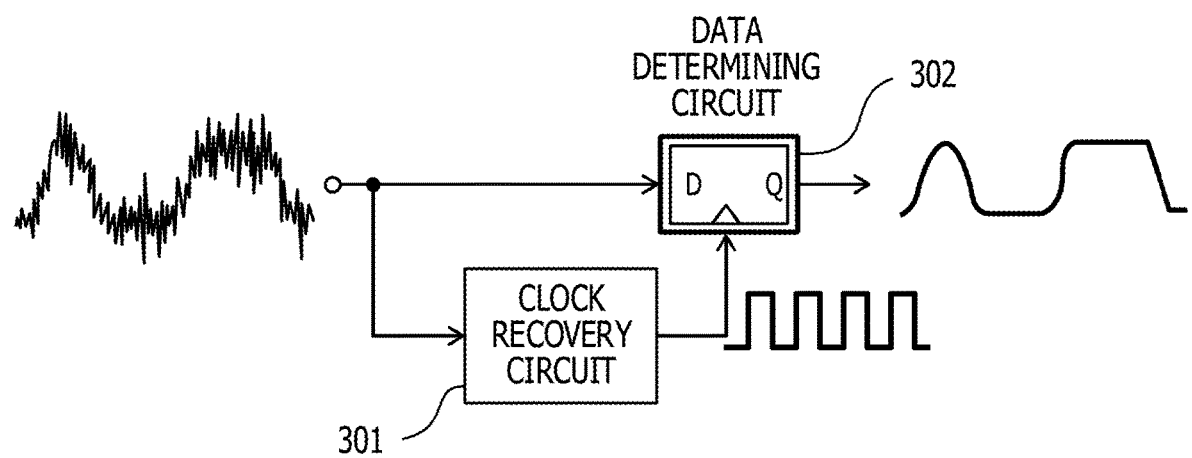
FIGS. 2A and 2B are diagrams of assistance in explaining an example of ordinary clock recovery circuits.
Figure 2B:
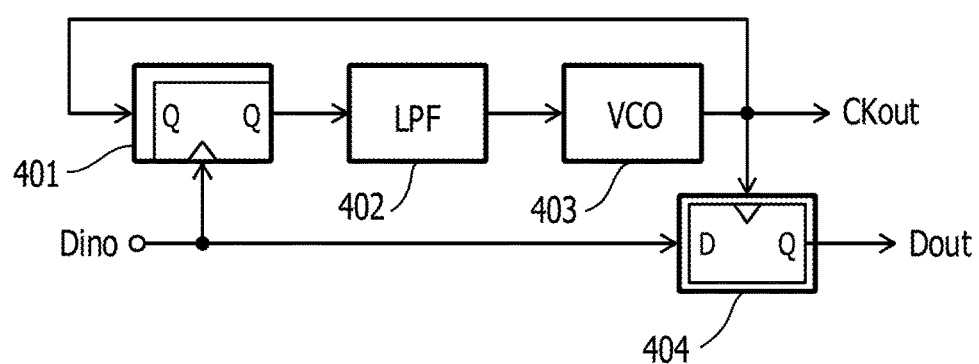

FIGS. 2A and 2B are diagrams of assistance in explaining an example of ordinary clock recovery circuits. Here, FIG. 2A is of assistance in explaining the generation of a clock in an RF tag to which a silicon semiconductor is applied. FIG. 2B is of assistance in explaining the generation of a clock in an RF tag to which an organic semiconductor is applied, for example.

As illustrated in FIG. 2A, for example, a clock recovery circuit 301 performs clock reproduction in an RFID by frequency-dividing a carrier (reproduces a clock instantly). It is therefore often that data (preamble or the like) for clock synchronization is not sent at a time of a start of communication. In fact, ISO 15693 and ISO 14443, for example, use no preamble. The RF tag to which a silicon semiconductor is applied, for example, receives a signal of 13.56 MHz sent from a reader, and generates a clock of 26 kHz by performing 1/512 frequency division of the carrier of 13.56 MHz (ISO 15693) or generates a clock of 106 kHz by performing 1/128 frequency division of the carrier of 13.56 MHz (ISO 14443).

However, in the RF tag to which an organic semiconductor is applied, the operating frequency of an oscillator is, for example, on the order of hundreds of kHz, and it is difficult to generate a clock having a symbol rate by frequency-dividing the carrier of 13.56 MHz from the reader. Therefore, when it is difficult to frequency-divide the carrier, for example, a loop referred to as a clock data recovery (CDR) similar to a PLL is used to generate a clock (periodic) from the input data signal (non-periodic) Din.

For example, as illustrated in FIG. 2B, a loop circuit is used which includes a flip-flop 401, a low-pass filter (LPF) 402, a voltage control oscillator (VCO) 403, and a retimer (flip-flop) 404. In the circuit illustrated in FIG. 2B, in a state in which the loop is locked, the output of the VCO 403 is synchronized with the symbol rate and timing of the input data signal Din. However, the loop takes a time constant (approximately 1/100 of the symbol rate) determined by a loop band to reach the locked state. Therefore, in a case where an RF tag having a 13.56-MHz band is produced with an organic transistor (organic semiconductor), for example, it is difficult to start reception immediately when data is received.

Figure 3:
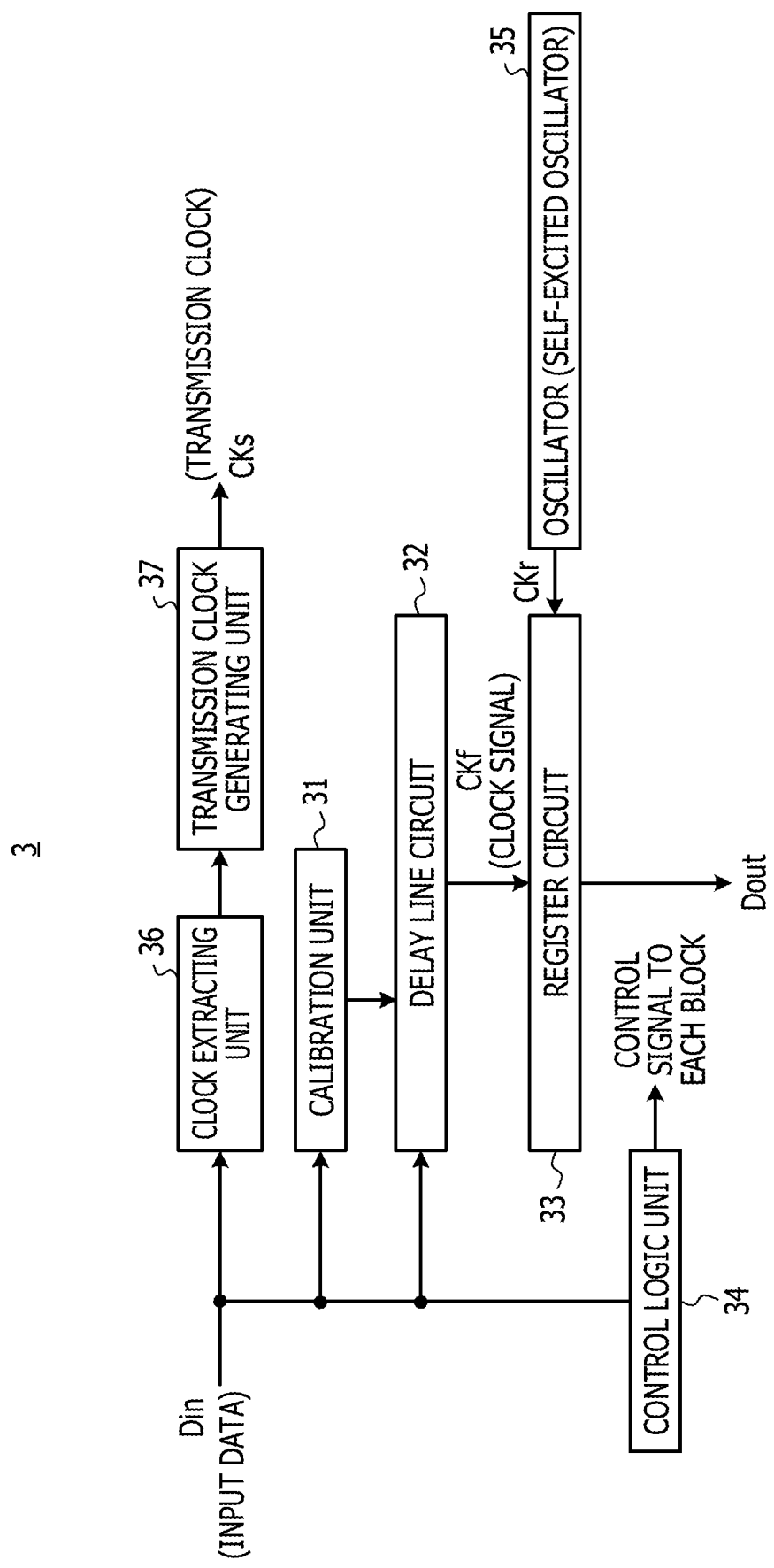
FIG. 3 is a block diagram schematically illustrating an example of an entire configuration of a clock recovery circuit according to the present embodiment.

FIG. 3 is a block diagram schematically illustrating an example of an entire configuration of a clock recovery circuit according to the present embodiment. The clock recovery circuit 3 according to the present embodiment includes a calibration unit 31, a delay line circuit 32, a register circuit 33, a control logic unit 34, an oscillator 35, a clock extracting unit 36, and a transmission clock generating unit 37. Incidentally, in the present specification, suppose that the clock recovery circuit 3 includes a control circuit (a logic circuit or a control logic unit) that generates a control signal for each circuit block and a circuit (a clock extracting unit and a transmission clock generating unit) that generates a transmission clock.

The calibration unit 31 performs calibration, for example, calibration of the delay line circuit 32 to be described later in detail, using calibration data (CLD) embedded in a part of the input data signal (output of the demodulating circuit) Din. The delay line circuit 32 includes a plurality of cascaded delay units (321 to 326). Each of the delay units includes a plurality of delay stages providing different amounts of delay. Further, the plurality of delay units in the delay line circuit 32 are calibrated by the calibration unit 31. The plurality of delay units generate a plurality of clocks (a multiphase clock: a first clock) CKf having different phases obtained by delaying the input data signal Din, and output the plurality of clocks to the register circuit 33.

The control logic unit 34 is configured to count transitions, for example, rising edges or falling edges from a head of the input data signal Din, and write data provided by the input data signal Din to the register circuit 33 after the count value becomes a given value. In addition, the register circuit 33 includes a plurality of registers arranged in a column direction. The control logic unit 34 performs control so as to write the data (received data) provided by the input data signal Din to each of the plurality of registers in order based on the data capturing clock CKf.

The oscillator 35 is, for example, a self-excited oscillator using inductance-capacitance (LC) resonance. The oscillator 35 generates a reading clock (second clock) CKr for consecutively reading and outputting data written to the register circuit 33 (plurality of registers), and outputs the reading clock (second clock) CKr to the register circuit 33. The reading clock CKr is, for example, a clock not based on the transitions of the input data signal Din, and may, for example, be set at a frequency suitable for a circuit that processes the data read from the register circuit 33.

The clock extracting unit 36 and the transmission clock generating unit 37 are, for example, intended to generate a transmission clock CKs for transmitting data to the reader 2. The clock extracting unit 36 receives the input data signal Din, and extracts given timing from the input data signal Din. The transmission clock generating unit 37 generates the transmission clock CKs by performing, for example, phase locking and multiplication processing based on the given timing in the input data signal Din.

For example, the clock extracting unit 36 extracts a clock of 53 kHz from the input data signal Din of 26.5 kbps. The transmission clock generating unit 37, for example, generates the transmission clock CKs of 424 kHz by performing phase locking by a PLL and performing eightfold multiplication. For example, in parallel with the generation of the clock for data determination (first clock CKf) described above, the transmission clock is generated in advance by reproducing a symbol rate clock in a CDR and performing integer multiplication of the symbol rate clock. It is thus possible to prepare for transmission operation after completion of reception.

Thus, the clock recovery circuit 3 according to the present embodiment may, for example, receive data using, as a multiphase clock, a clock obtained by delaying the input data signal Din without using a VCO or a PLL. Incidentally, in order to generate the multiphase clock CKf, it is desired to determine how much the data is delayed. Therefore, the delay line circuit 32 is calibrated using a part of a data series. Then, after completion of capturing of the received data with the multiphase clock CKf, the data may be sequentially read using another clock (self-excited oscillator 35). Further, when a result of processing of the received data is transmitted to the reader 2, an accurate clock is desired. In parallel with the above-described reception processing, the clock extracting unit 36 and the transmission clock generating unit 37 provided separately generate the transmission clock CKs. It is thereby possible also to shorten a waiting time before a start of transmission.

Figure 4D:
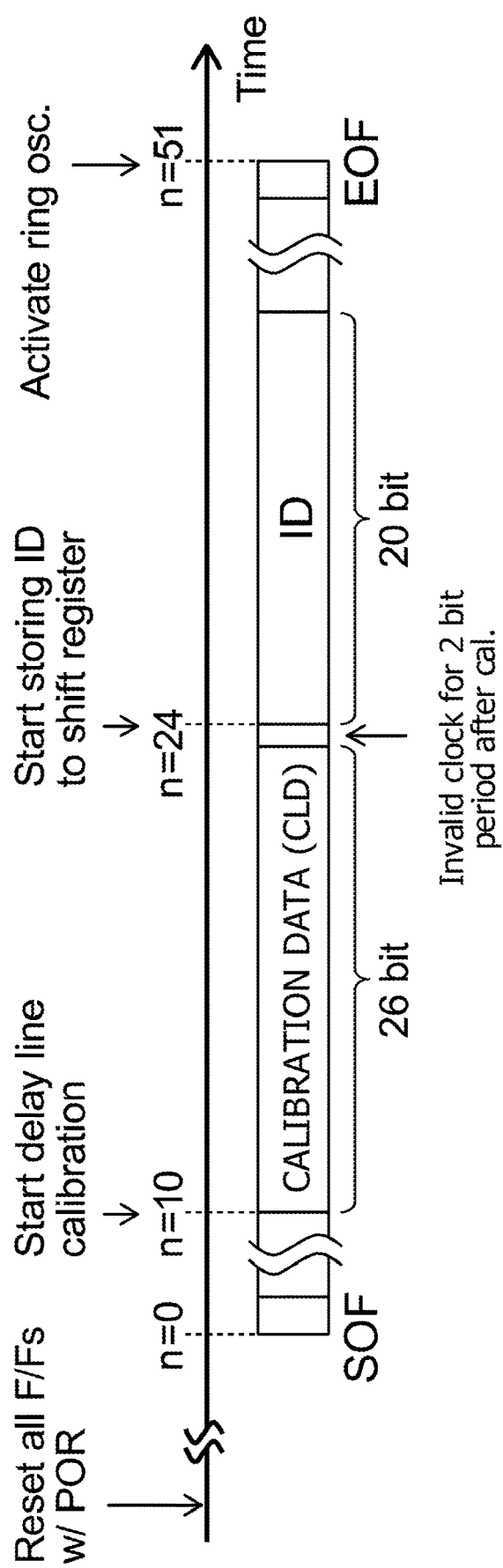

FIGS. 4A, 4B, 4C, and 4D are diagrams of assistance in explaining a case where ISO 15693 is applied to the present embodiment. Here, FIG. 4A illustrates a command format (Command format). FIG. 4B illustrates a code format (Coding format). In addition, FIG. 4C illustrates standards of a bit rate (26.48 kbps) and data code (pulse position modulation (PPM)) in ISO 15693. FIG. 4D is a diagram of assistance in explaining calibration data (CLD).

As illustrated in FIG. 4A, for example, a "stay quiet" command of ISO 15693 includes a start of frame (SOF), followed by a flag (Flag: 8 bits), a command code (Command code: 8 bits), and a unique identifier (UID) (a bit region open to a user: 48 bits). The "stay quiet" command further includes a fixed code (fixed code: 16 bits), a cyclic redundancy check (CRC) (16 bits), and an end of frame (EOF).

As illustrated in FIG. 4C, a coding system in ISO 15693 is a PPM system, and expresses four kinds of "00," "01," "10," and "11" by positions at which a pause (Pause: a low level "0" for only a period (9.44 µs) of 1/8 of one cycle (75.52 µs)) appears. As illustrated in FIG. 4D, calibration data CLD embedded in a part of the input data signal Din (command) is, for example, assigned 26 bits in the UID of the command, and following a clock invalid region of 2 bits, 20 bits are allocated as an ID.

For example, the calibration data (CLD) is embedded in a beginning part of the input data signal Din (first part in the command). The data capturing clock (clock for data determination) CKf is reproduced based on the calibration data. Then, data in a second part (region of 20 bits for the ID) subsequent to the first part is read using the reproduced clock CKf for data determination. For example, as illustrated in FIG. 4D, calibration (calibration of the delay line circuit 32 based on the CLD) is started at n=10, and storage of the ID into the register circuit 33 (determination and writing of the received data stored in the ID based on CKf) is performed at n=24. Further, at and following n=51, the received data (ID) stored in the register circuit 33 is read and output according to the reading clock CKr from the oscillator 35. Incidentally, the command (input data signal Din) in which CLD is embedded may be sent once, and may also, for example, be sent from the reader (smart phone) 2 a plurality of times.

Figures 5A, 5B:
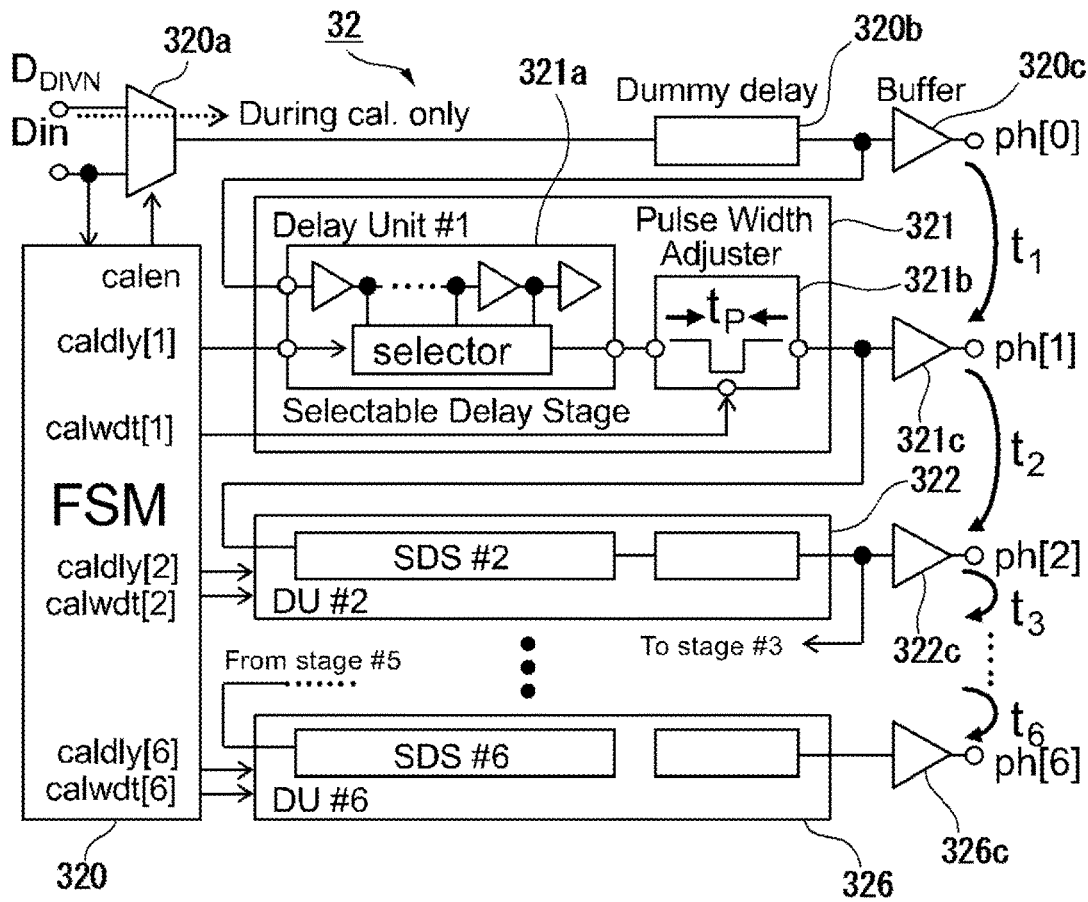
FIGS. 5A and 5B are diagrams of assistance in explaining an example of a delay line circuit in the clock recovery circuit illustrated in FIG. 3.
Figure 6:
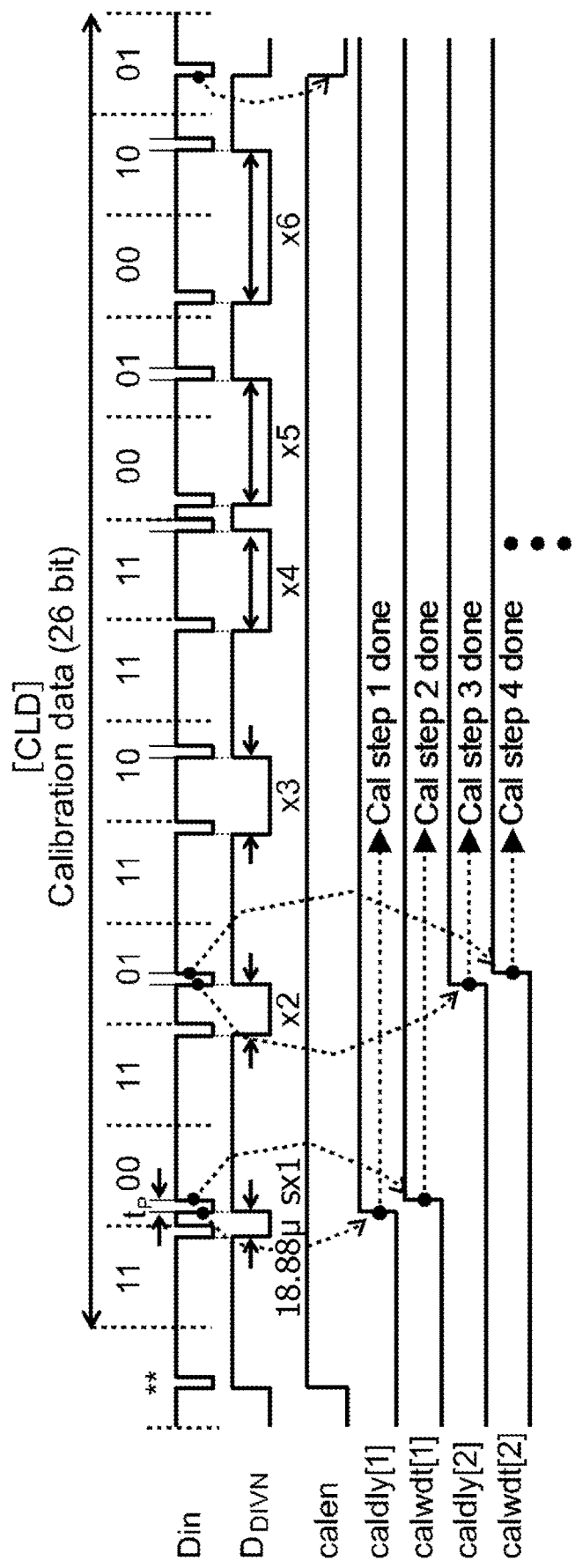
FIG. 6 is a diagram of assistance in explaining calibration by the delay line circuit illustrated in FIG. 5A.

FIGS. 5A and 5B are diagrams of assistance in explaining an example of a delay line circuit in the clock recovery circuit illustrated in FIG. 3. FIG. 6 is a diagram of assistance in explaining calibration by the delay line circuit illustrated in FIG. 5A. Here, FIG. 5A is a block diagram illustrating an entire configuration of the delay line circuit 32. FIG. 5B illustrates a goal (Goal) of the calibration and steps (Cal. steps) of the calibration.

As illustrated in FIG. 5A, the delay line circuit 32 includes a control unit (FSM) 320, a selector 320a, a dummy delay unit 320b, a plurality of cascaded delay units (six delay units as an example in FIG. 5A) (Delay Units #1 to #6) 321 to 326, and a plurality of buffers. The delay units 321 to 326 have a similar configuration. For example, the delay unit 321 includes a delay amount selecting unit (Selectable Delay Stage) 321a including a plurality of delay stages and a selector and a pulse width adjusting unit (Pulse Width Adjuster) 321b. The outputs of the delay units 321 to 326 are output as phase signals Ph[1] to Ph[6] via respective buffers 321c to 326c.

Incidentally, only during the calibration, the output ($D_{VIN}$) of the selector 320a is output as a phase signal Ph[0] via the dummy delay unit 320b and a buffer 320c. In addition, the output of the dummy delay unit 320b is input to the delay unit 321 in a first stage. The output of the delay unit 321 in the first stage is input to the delay unit 322 in a second stage. Similarly, the output of the delay unit 325 in a fifth stage is input to the delay unit 326 in a sixth stage. The delay amount selecting unit (321a) and the pulse width adjusting unit (321b) in each of the delay units 321 to 326 are controlled based on signals from the control unit 320.

As illustrated in FIG. 5B and FIG. 6, the goal (Goal) of the calibration is to make a phase difference (time difference) $t_1$ between the signals Ph[0] and Ph[1] substantially equal to 18.88 μs, make a time difference $t_2$ between Ph[1] and Ph[2] substantially equal to 18.88 μs×2, . . . , and make a time difference $t_6$ between Ph[5] and Ph[6] substantially equal to 18.88 μs×6. Then, as calibration processing (Cal. steps), $t_1$ is calibrated by controlling the delay amount selecting unit 321a of the delay unit 321 in the first stage, and a pulse width is calibrated by controlling the pulse width adjusting unit 321b of the delay unit 321 in the first stage. Similarly, $t_6$ is calibrated by controlling the delay amount selecting unit of the delay unit 326 in the sixth stage, and a pulse width is calibrated by controlling the pulse width adjusting unit of the delay unit 326 in the sixth stage. Incidentally, as described with reference to FIG. 4D, the calibration data (Calibration data (26 bits)) is, for example, the input data signal Din based on the data (CLD) of 26 bits assigned to the UID (48 bits) of the command in the input data signal Din.

Figure 8A:
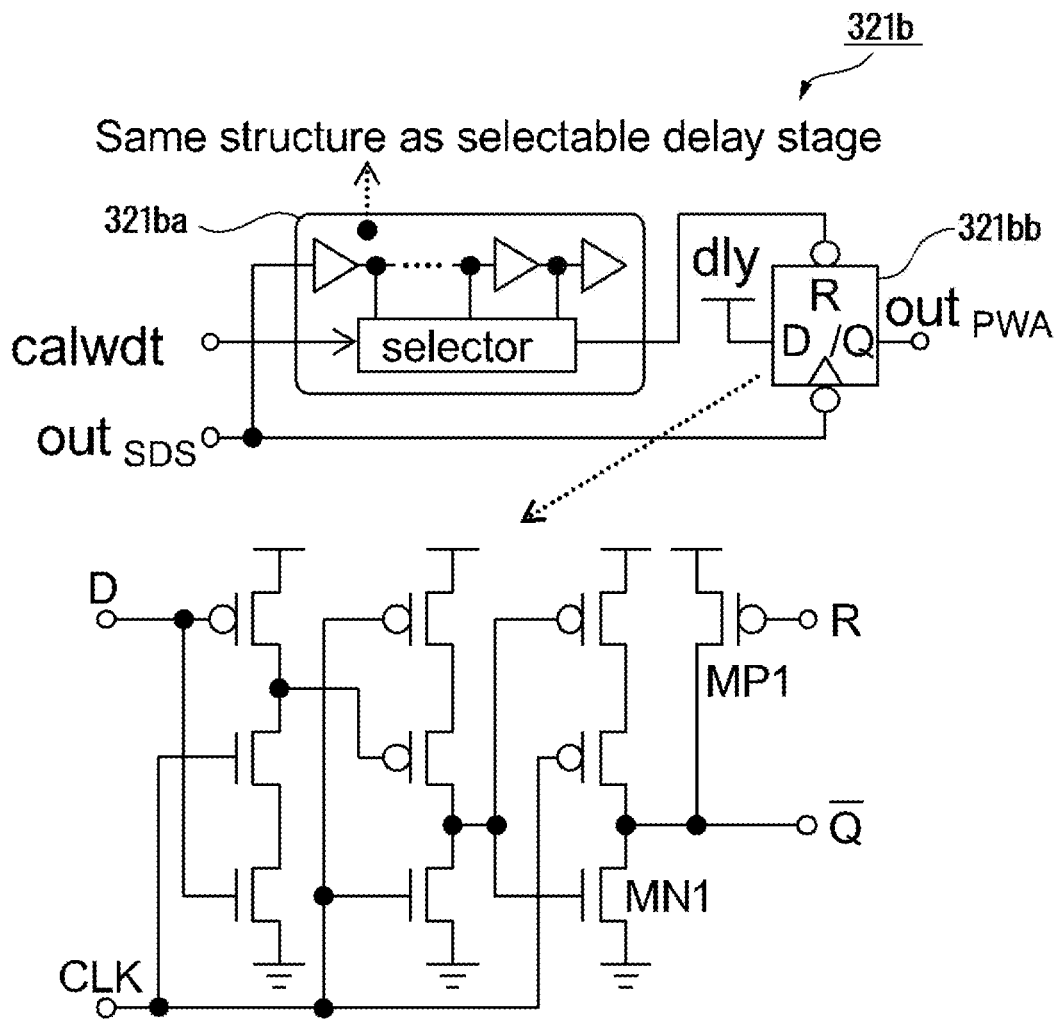
FIGS. 8A and 8B are diagrams (2) of assistance in explaining, in more detail, the delay line circuit described with reference to FIGS. 5A and 5B and FIG. 6.
Figure 8B:
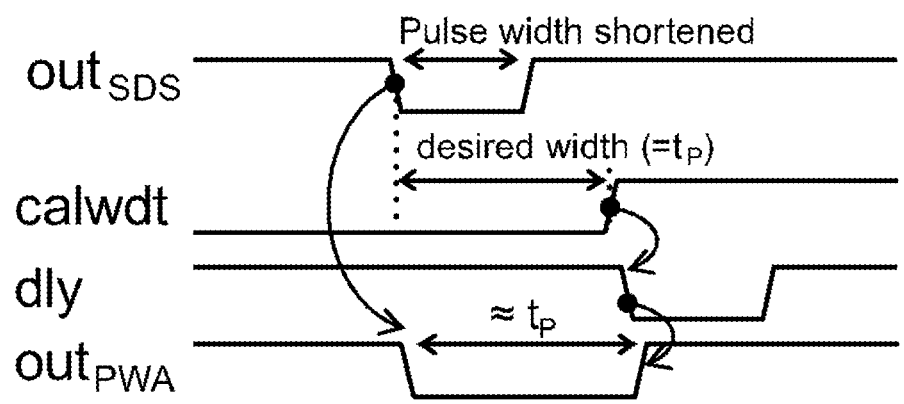

FIGS. 7A, 7B, and 7C and FIGS. 8A and 8B are diagrams of assistance in explaining, in more detail, the delay line circuit described with reference to FIGS. 5A and 5B and FIG. 6. For example, FIGS. 7A to 7C are of assistance in explaining an example of the delay amount selecting unit (321a) in FIG. 5A. FIGS. 8A and 8B are of assistance in explaining an example of the pulse width adjusting unit (321b) in FIG. 5A.

FIG. 7A illustrates a delay amount selecting unit in an ith stage. With i=1 (the delay amount selecting unit 321a of the delay unit 321 in the first stage), an input $in_{SDS}$ is coupled to the output of the dummy delay unit 320b. An output $out_{SDS}$ is coupled to the input of the pulse width adjusting unit 321b. In addition, in the delay amount selecting unit of the delay unit 322 in the second stage, an input $in_{SDS}$ is coupled to the output of the delay unit 321 (pulse width adjusting unit 321b) in the first stage, and an output $out_{SDS}$ is coupled to the input of the pulse width adjusting unit in the second stage. FIG. 7B illustrates relation between a control signal caldly from the control unit (FSM) 320 and outputs $m_x$ ($m_i$, $m_{i+1}$, $m_{i+2}$, . . . ) and $n_x$ ($n_i$, $n_{i+1}$, $n_{i+2}$, . . . ) of each delay stage (inverter) selected by caldly. FIG. 7C illustrates changes in levels "0," "1," "1," . . . of respective nodes $S_i$, $S_{i+1}$, $S_{i+2}$, . . . in FIG. 7A.

FIG. 8A illustrates a pulse width adjusting unit in an ith stage, and illustrates i=1 (the pulse width adjusting unit 321b of the delay unit 321 in the first stage). As illustrated in FIG. 8A, the pulse width adjusting unit 321b includes a circuit 321ba having the same configuration as the delay amount selecting unit 321a and a flip-flop (D-FF) 321bb. The flip-flop 321bb has a data input terminal to which dly is input, has a reset terminal to which the output of the circuit 321ba is input after being logically inverted, and has an inverting output terminal from which an output $out_{PWA}$ is output. FIG. 8B illustrates relation between control signals calwdt and dly from the control unit 320 and the output $out_{PWA}$. The pulse width (period of "1") of the output $out_{PWA}$ may be controlled to a desired length. It is to be noted that the delay amount selecting unit and the pulse width adjusting unit described above are a mere example, and are of course susceptible of various modifications and changes. It is to be noted that while the circuits illustrated in FIG. 7A and FIG. 8A and circuits to be described in the following may be realized by applying organic transistors (organic semiconductors), the application of the present embodiment is not limited to organic semiconductors.

Figure 9:
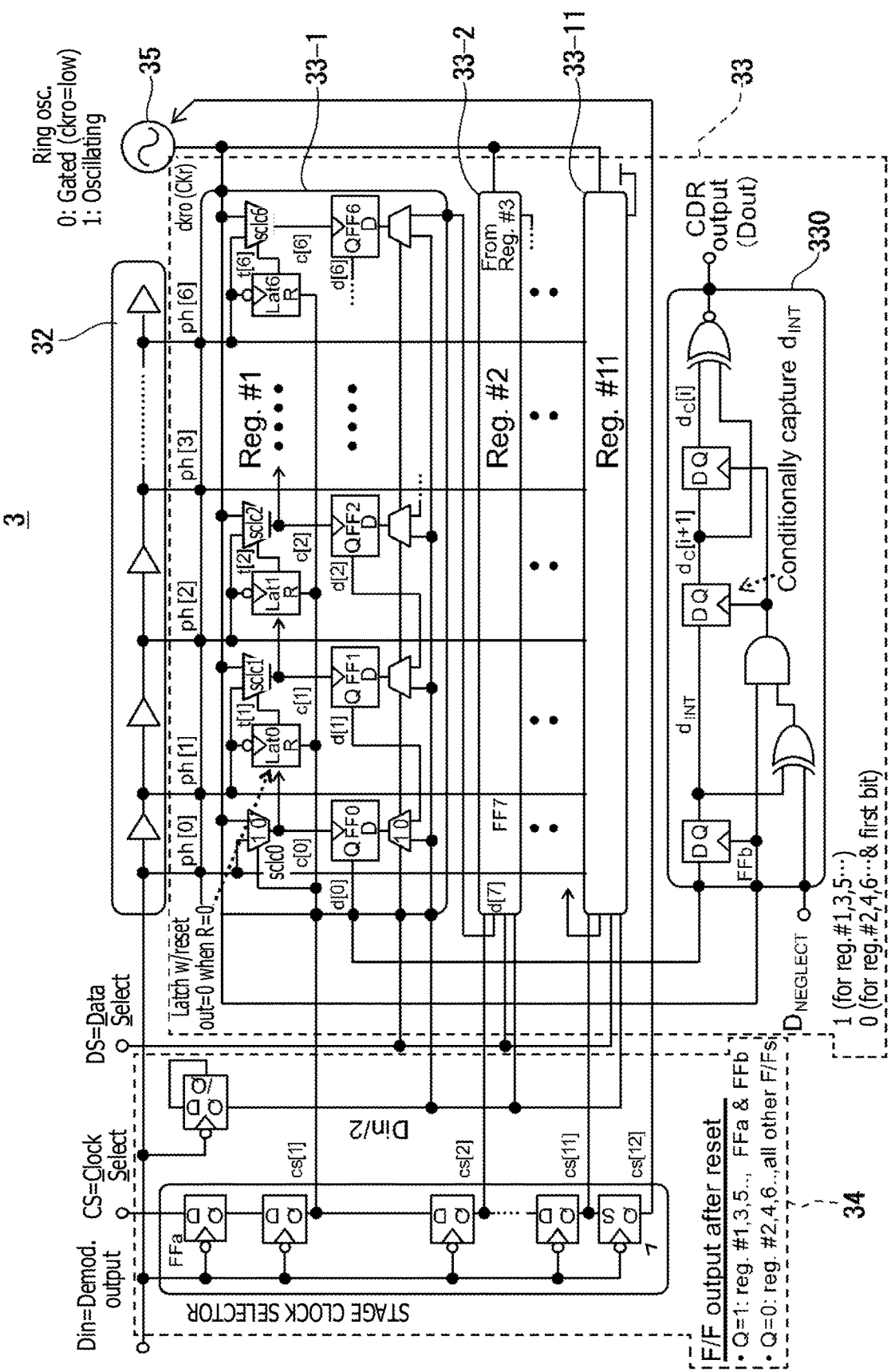
FIG. 9 is a block diagram illustrating a first example of the clock recovery circuit illustrated in FIG. 3.

FIG. 9 is a block diagram illustrating a first example of the clock recovery circuit illustrated in FIG. 3. FIGS. 10A and 10B and FIG. 11 are diagrams of assistance in explaining operation of the clock recovery circuit in the first example illustrated in FIG. 9. Here, FIG. 10A is a timing chart of assistance in explaining the operation of the clock recovery circuit illustrated in FIG. 9. FIG. 10B is a diagram of assistance in explaining states of the registers in the clock recovery circuit of FIG. 9. In addition, FIG. 11 illustrates the timing chart of FIG. 10A in more detail.

In FIG. 9, the calibration unit 31 illustrated in FIG. 3 is omitted. In FIG. 9, the register circuit 33 includes 11 registers 33-1 to 33-11 (Reg. #1 to #11). However, this is intended for application to the command format of ISO 15693 described with reference to FIGS. 4A to 4D, and may of course be changed according to the system applied. In addition, output data D[0] to D[6] of seven flip-flops is illustrated so as to correspond to the representations of data "00," "01," "10," and "11" by each of the registers #1 to #11 according to positions at which a pause appears. Incidentally, as illustrated in FIG. 10B, in the 11 registers #1 to #11, the flip-flops of the registers in the odd-numbered stages (#1, #3, . . . #11) are all reset to "0," and the flip-flops of the registers in the even-numbered stages (#2, #4, . . . #10) are all reset to "1."

As described earlier, the flip-flops of the plurality of the registers #1 to #11 are provided with the phase signals ph[1] to ph[6] whose delay is gradually increased when the input data signal Din passes through the delay line circuit 32. Incidentally, the phase signal ph[0] has the same timing as the input data signal Din. The respective flip-flops of the registers #1 to #11 capture data by using the rising edges of these phase signals ph[0] to ph[6] as a clock. Incidentally, the data captured by the flip-flops is not the input data signal Din itself, and is, for example, the input data signal Din/2, which is obtained by frequency division by two by a toggle flip-flop.

As illustrated in FIG. 10A, FIG. 10B, and FIG. 11, each time a falling edge occurs in the input data signal Din (Din/2), a writing destination register is changed by one stage (for example, from the register #1 to the register #2). This register change is controlled by control signals cs[1] to cs[11] from a stage clock selector 340 included in the control logic unit 34, for example.

Here, the control signals cs[1] to cs[11] are all "0" before a start of data capturing. Only cs[1] becomes "1" immediately after the start. When a falling edge appears in the input data signal Din, cs[1] becomes "0" and cs[2] becomes "1." When a falling edge next appears in the input DIN, cs[1] and cs[2] become "0" and cs[3] becomes "1." When writing up to the register #11 is ended, cs[12] becomes "1." This enables the oscillator (ring oscillator) 35.

A writing procedure for the register #1 (33-1) will next be described. First, before data capturing is started, cs[1]="0," and all outputs t[1] to t[6] are "0" because latches (Lat0 to Lat6) have been reset. Therefore, clock selectors (selc0 to selc6) all select the output (output="0" (Low)) $CK_{RO}$ (CKr) of the ring oscillator 35. Then, after cs[1] becomes "1," the output c[0] of the clock selector selc0 switches from the output of the ring oscillator 35 to ph[0]. Thereafter, data is captured by the flip-flop FF0 according to a rising edge of c[0], and c[0] becomes "1."

In addition, when ph[1] falls, c[0]=1 is transferred to t[1], so that t[1] becomes "1." The output c[1] of selc1 is switched from the output of the ring oscillator 35 to ph[1]. Thereafter, data is captured by the flip-flop FF1 according to a rising edge of c[1], and c[1] becomes "1."

Further, when ph[2] falls, c[1]="1" is transferred to t[2], so that t[2] becomes "1." The output c[2] of selc2 is switched from the output of the ring oscillator 35 to ph[2]. Then, when cs[1] becomes "0" and cs[2] becomes "1," the selectors selc0 to selc6 of the register #1 select the output of the ring oscillator 35 again. Meanwhile, the output c[7] of the selector selc7 of the register #2 switches from the output of the ring oscillator 35 to ph[0]. Incidentally, the registers #2 to #11 (33-2 to 33-11) also operate in a similar manner to the register #1 (33-1).

Here, there is 1:1 correspondence relation between the output of the clock recovery circuit (CDR) 3 in the present first example and real data (Original data). For example, "1000" corresponds to "00," "0100" corresponds to "01," "0010" corresponds to "10," and "0001" corresponds to "11."

Figure 12:
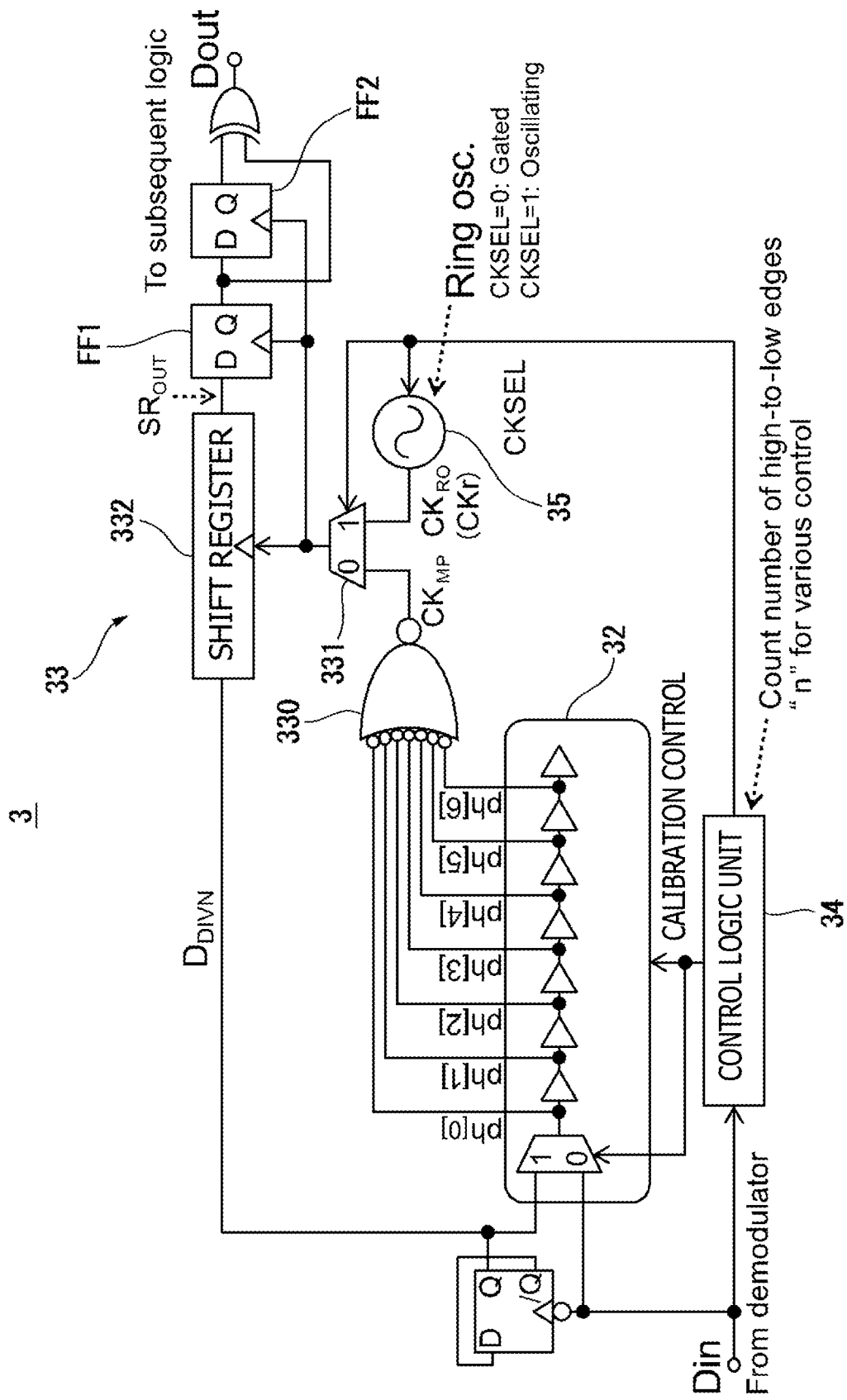
FIG. 12 is a block diagram illustrating a second example of the clock recovery circuit illustrated in FIG. 3.

FIG. 12 is a block diagram illustrating a second example of the clock recovery circuit illustrated in FIG. 3. FIGS. 13A and 13B are diagrams of assistance in explaining operation of the clock recovery circuit in the second example illustrated in FIG. 12. Here, FIG. 13A is a timing chart of assistance in explaining the operation of the clock recovery circuit illustrated in FIG. 12. FIG. 13B is a diagram of assistance in explaining states of output of a shift register in the clock recovery circuit of FIG. 12.

The calibration unit 31 illustrated in FIG. 3 is omitted also in FIG. 12. In addition, the clock recovery circuit in the present second example is also configured based on the command format of ISO 15693 described with reference to FIGS. 4A to 4D, and is of course susceptible of various modifications and changes according to the system applied.

As illustrated in FIG. 12, when the input data signal Din passes through the delay line circuit 32, phase signals ph[1] to ph[6] whose delay is gradually increased are generated, and are input to a six-input NOR gate 330. Here, the phase signals ph[1] to ph[6] are the same signals as in the first example described with reference to FIGS. 9 to 11. Signals obtained by logically inverting the phase signals ph[1] to ph[6] are input to the NOR gate 330. For example, the NOR gate 330 functions as an AND gate for the non-inverted logic signals ph[1] to ph[6]. Incidentally, a signal $D_{DVIN}$ in the present second example is obtained by frequency division of the input data signal Din by two by a toggle flip-flop, and corresponds to the signal Din/2 in the first example. In addition, in the present second example, the delay line circuit 32 is a buffer chain formed by cascading a plurality of buffers, and is adjusted by calibration such that an amount of delay between adjacent buffers is 18.88 µs.

Accordingly, a clock $CK_{MP}$ is generated by obtaining an AND (logic product) of seven signals, for example, phase signals Ph[1] to Ph[6] and ph[0] (same timing as Din). The clock $CK_{MP}$ is input to a selector 331 together with the output $CK_{RO}$ (CKr) of the oscillator 35. A signal selected by the selector 331 is output to a shift register (Shift register) 332. For example, received data is captured (written) into the shift register 332 by, for example, hitting the data $D_{DVIN}$ obtained by frequency division of the input data signal Din by two using the output $CK_{RO}$ of the oscillator 35.

As advantages of the second example, the number of flip-flops used may be reduced as compared with the first example described earlier, and also a circuit configuration is simplified. On the other hand, the second example has a disadvantage in that an operating speed desired for the flip-flops is increased because the shift register 332 that captures data is operated at the same speed as a data rate. For example, in the first example, each flip-flop performs capturing operation only once during a data capturing period, and may therefore have a low speed. In the present second example, on the other hand, flip-flops having higher speed than in the first example are desired.

It is to be noted that the configurations of the delay line circuit 32, the register circuit 33, and the like described above are a mere example, and are of course susceptible of various modifications and changes. In addition, the clock recovery circuit according to the present embodiment may, for example, be applied as the clock recovery circuit 3 in the short-range radio communication circuit unit 1b of the RF tag 1 described with reference to FIG. 1, but is not limited to being applied to RF tags. In addition, the present embodiment is expected to produce a great effect in applications to RF tags to which organic semiconductors (organic transistors) are applied, for example. However, the applied transistors are of course not limited to organic semiconductors.

The embodiment has been described above. However, all of examples and conditions described herein are described for a purpose of aiding in understanding of the present technology and the concept of the present technology to be applied to technologies. The examples and the conditions described specifically are not intended to limit the scope of the present technology. In addition, such description of the specification does not illustrate advantages or disadvantages of the present technology. While the embodiment of the present technology has been described in detail, it is to be understood that various changes, substitutions, and modifications may be made therein without departing from the spirit and scope of the present technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A clock recovery circuit comprising:
a delay line circuit configured to output a plurality of first clocks, which are periodic signals, having different phases obtained by delaying an input data signal which is a non-periodic data signal;
a register circuit configured to determine and write received data in the input data signal based on the first clocks;
a control circuit configured to control the writing of the data in the register circuit based on transitions of the input data signal; and
an oscillator configured to generate a second clock for consecutively reading and outputting the data written to the register circuit.

2. The clock recovery circuit according to claim 1, wherein the control circuit calibrates a plurality of delay units included in the delay line circuit based on calibration data embedded in a part of the input data signal.

3. The clock recovery circuit according to claim 2, wherein the calibration data is embedded in a beginning part of the input data signal.

4. The clock recovery circuit according to claim 3, wherein the calibration data is embedded in a first part in a command, and the register circuit writes data in a second part subsequent to the first part to the register circuit based on the first clocks.

5. The clock recovery circuit according to claim 1, wherein the second clock is a clock not based on the transitions of the input data signal.

6. The clock recovery circuit according to claim 1, wherein the control circuit counts transitions from a head of the input data signal, and the register circuit writes the received data in the input data signal after a count value of the transitions from the head of the input data signal becomes a given value.

7. The clock recovery circuit according to claim 1, wherein the register circuit includes a plurality of registers arranged in a column direction, and the plurality of registers store the received data in the input data signal in order based on the first clocks.

8. The clock recovery circuit according to claim 1, further comprising:
a clock extracting unit configured to receive the input data signal and extract a clock from the input data signal; and
a transmission clock generating unit configured to generate a transmission clock by performing phase locking and multiplication processing based on the extracted clock.

9. A semiconductor integrated circuit device comprising:
a communication circuit configured to communicate with an external, including:
a delay line circuit configured to output a plurality of first clocks, which are periodic signals, having different phases obtained by delaying an input data signal which is a non-periodic data signal;
a register circuit configured to determine and write received data in the input data signal based on the first clocks;
a control circuit configured to control the writing of the data in the register circuit based on transitions of the input data signal; and
a sensor circuit configured to operate on the basis of a control signal received from the communication circuit; and
an oscillator configured to generate a second clock for consecutively reading and outputting the data written to the register circuit.

10. The semiconductor integrated circuit device according to claim 9, wherein the control circuit calibrates a plurality of delay units included in the delay line circuit based on calibration data embedded in a part of the input data signal, the calibration data is embedded in a beginning part of the input data signal and the calibration data is embedded in a first part in a command, and the register circuit writes data in a second part subsequent to the first part to the register circuit based on the first clocks.

11. The semiconductor integrated circuit device according to claim 9, wherein the control circuit counts transitions from a head of the input data signal, and the register circuit writes the received data in the input data signal after a count value of the transitions from the head of the input data signal becomes a given value.

12. The semiconductor integrated circuit device according to claim 9, wherein the register circuit includes a plurality of registers arranged in a column direction, and the plurality of registers store the received data in the input data signal in order based on the first clocks.

13. The semiconductor integrated circuit device according to claim 9, further comprising:
a clock extracting circuit configured to receive the input data signal and extract a clock from the input data signal; and
a transmission clock generator configured to generate a transmission clock by performing phase locking and multiplication processing based on the extracted clock.

14. A radio frequency tag comprising:
a communication circuit configured to communicate with an external, including:
a delay line circuit configured to output a plurality of first clocks, which are periodic signals, having different phases obtained by delaying an input data signal which is a non-periodic data signal;
a register circuit configured to determine and write received data in the input data signal based on the first clocks; and
a control circuit configured to control the writing of the data in the register circuit based on transitions of the input data signal;
a sensor circuit configured to operate on the basis of a control signal received from the communication circuit;
an oscillator configured to generate a second clock for consecutively reading and outputting the data written to the register circuit;
an antenna configured to send a communication signal to the external; and
a battery configured to supply power to the sensor circuit.

15. The radio frequency tag according to claim 14, wherein the control circuit calibrates a plurality of delay units included in the delay line circuit based on calibration data embedded in a part of the input data signal, the calibration data is embedded in a beginning part of the input data signal and the calibration data is embedded in a first part in a command, and the register circuit writes data in a second part subsequent to the first part to the register circuit based on the first clocks.

16. The radio frequency tag according to claim 14, wherein the control circuit counts transitions from a head of the input data signal, and the register circuit writes the received data in the input data signal after a count value of the transitions from the head of the input data signal becomes a given value.

17. The radio frequency tag according to claim 14, wherein the register circuit includes a plurality of registers arranged in a column direction, and the plurality of registers store the received data in the input data signal in order based on the first clocks.

18. The radio frequency tag according to claim 14, further comprising:
   a clock extracting circuit configured to receive the input data signal and extract a clock from the input data signal; and
   a transmission clock generator configured to generate a transmission clock by performing phase locking and multiplication processing based on the extracted clock.

* * * * *